United States Patent
Zhang et al.

(10) Patent No.: US 10,855,279 B2
(45) Date of Patent: Dec. 1, 2020

(54) DATA INTERFACE, CHIP, AND CHIP SYSTEM

(71) Applicant: SHENZHEN GOODIX TECHNOLOGY CO., LTD., Shenzhen (CN)

(72) Inventors: Mengwen Zhang, Shenzhen (CN); Boxin Yang, Shenzhen (CN); Lvfan Yi, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/658,063

(22) Filed: Oct. 19, 2019

(65) Prior Publication Data
US 2020/0052701 A1    Feb. 13, 2020

Related U.S. Application Data

(63) Continuation of application No. PCT/CN2018/100290, filed on Aug. 13, 2018.

(51) Int. Cl.
  *H03K 19/0185*    (2006.01)
  *H05F 3/00*    (2006.01)
  *H02H 9/04*    (2006.01)

(52) U.S. Cl.
  CPC ....... *H03K 19/018507* (2013.01); *H05F 3/00* (2013.01); *H02H 9/046* (2013.01)

(58) Field of Classification Search
  CPC ... H03K 19/018507; H03K 19/018521; H03K 19/18592; H03K 19/0013; H04L 25/0264; H05F 3/00; H02H 9/046
  See application file for complete search history.

(56) References Cited

U.S. PATENT DOCUMENTS 6,014,410 A  *  1/2000  Ooishi ..................... H04B 3/02
                                                        375/220
6,140,834 A  *  10/2000  Takahashi ...... H03K 19/018528
                                                        326/21

(Continued)

FOREIGN PATENT DOCUMENTS

| CN | 202759437 U | 2/2013 |
| CN | 203205866 U | 9/2013 |
| CN | 103369809 A | 10/2013 |

*Primary Examiner* — Thomas J. Hiltunen

(57) ABSTRACT

A data interface is disclosed, which includes an electrostatic discharge circuit, and a charge transmitting circuit connected to a binding wire through the electrostatic discharge circuit; the charge transmitting circuit includes a first capacitor, the charge transmitting circuit transfers charges in the first capacitor to a parasitic capacitor of the electrostatic discharge circuit and a parasitic capacitor of the binding wire, to generate a first voltage signal and output the first voltage signal through the binding wire. According to the data interface, charges in a charging capacitor and a parasitic capacitor are redistributed, which could not only reduce a power consumption loss caused by a parasitic capacitor in a communication channel but also effectively reduce time delay. In addition, the use of dual-wire communication is avoided by using single-wire communication, and the manufacturing costs are reduced relative to low-voltage differential signaling (LVDS).

19 Claims, 4 Drawing Sheets

(56) References Cited

U.S. PATENT DOCUMENTS

| | | | |
|---|---|---|---|
| 7,620,121 B1* | 11/2009 | Tetzlaff | H04L 25/0296 |
| | | | 327/303 |
| 8,611,437 B2* | 12/2013 | Poulton | H04B 1/04 |
| | | | 375/257 |
| 9,001,902 B2* | 4/2015 | Matsumoto | H04L 25/06 |
| | | | 375/259 |
| 9,170,980 B2* | 10/2015 | Dally | G06F 15/7864 |
| 9,338,036 B2* | 5/2016 | Poulton | H04L 25/0272 |
| 9,917,585 B2* | 3/2018 | Lee | H03K 19/017509 |
| 10,326,437 B2* | 6/2019 | Muto | H03K 17/16 |
| 2011/0141829 A1* | 6/2011 | Ware | G11C 7/1048 |
| | | | 365/189.09 |
| 2011/0199122 A1 | 8/2011 | Morishita et al. | |
| 2013/0195165 A1 | 8/2013 | Poulton et al. | |
| 2013/0265688 A1 | 10/2013 | Tang | |
| 2014/0044159 A1 | 2/2014 | Poulton et al. | |
| 2014/0091848 A1 | 4/2014 | Morishita et al. | |
| 2014/0281383 A1* | 9/2014 | Dally | G06F 15/7864 |
| | | | 712/42 |
| 2017/0222649 A1 | 8/2017 | Koo et al. | |
| 2018/0175860 A1 | 6/2018 | Koo et al. | |
| 2019/0280679 A1* | 9/2019 | Iyer | G06F 13/4072 |
| 2019/0347229 A1* | 11/2019 | Hogan | G06F 1/20 |

* cited by examiner

DATA INTERFACE, CHIP, AND CHIP SYSTEM

CROSS REFERENCE TO RELATED APPLICATIONS

The present application is a continuation of international application No. PCT/CN2018/100290, filed on Aug. 13, 2018, which is hereby incorporated by reference in its entirety.

TECHNICAL FIELD

Embodiments of the present disclosure relate to the communications field, and in particular, to a data interface, a chip, and a chip system.

BACKGROUND

In multi-chip (such as, a plurality of microcontroller units (MCU)) packaging, data communication is inevitably required between the multiple chips.

In the related art, a general purpose input output (GPIO) interface is generally used. However, since parasitic capacitances of two interconnected GPIOs and a parasitic capacitance of wiring between the two GPIOs are up to an order of 10 picofarad (pf), it leads to excessive power consumption of parasitic capacitors in a high-speed transmission scenario.

In order to resolve a problem of excessive power consumption of the GPIOs, low-voltage differential signaling (LVDS) may be used for data communication. However, LVDS generally requires two sets of pins, which increases interconnection costs and manufacturing costs.

SUMMARY

A data interface, a chip and a chip system are provided. The data interface could not only effectively reduce power consumption of a parasitic capacitor, but also reduce manufacturing costs.

According to a first aspect, provided is a data interface, including:

an electrostatic discharge circuit; and a charge transmitting circuit, connected to a binding wire through the electrostatic discharge circuit, where the charge transmitting circuit includes a first capacitor, the charge transmitting circuit transfers charges in the first capacitor to a parasitic capacitor of the electrostatic discharge circuit and a parasitic capacitor of the binding wire, to generate a first voltage signal and output the first voltage signal through the binding wire.

According to the data interface of an embodiment of the present disclosure, charges in a charging capacitor and a parasitic capacitor are redistributed, which could not only reduce a power consumption loss caused by a parasitic capacitor in a communication channel but also effectively reduce time delay. In addition, the use of dual-wire communication is avoided by using single-wire communication, and the manufacturing costs are reduced relative to LVDS.

In some possible implementations, the charge transmitting circuit includes:

the first capacitor, a first metal oxide semiconductor (MOS) transistor, a second MOS transistor and a third MOS transistor;

where a source of the first MOS transistor is configured to receive a power supply voltage, a drain of the first MOS transistor is connected to the ground through the first capacitor, a gate of the first MOS transistor is configured to receive a first control signal, the drain of the first MOS transistor is connected to a source of the second MOS transistor, a drain of the second MOS transistor is configured to output the first voltage signal, a gate of the second MOS transistor is configured to receive the first control signal, and the drain of the second MOS transistor is connected to the ground through the third MOS transistor, and a gate of the third MOS transistor is configured to receive a second control signal.

In some possible implementations, the first control signal and the second control signal are both control signals generated according to a third control signal, and when a voltage value of the third control signal is at a first level, the second MOS transistor is turned on, and the first MOS transistor and the third MOS transistor are turned off; when a voltage value of the third control signal is at a second level, the second MOS transistor is turned off, the first MOS transistor and the third MOS transistor are turned on, and the first level is greater than the second level.

In some possible implementations, the data interface further includes:

a signal receiving and converting circuit;

where the signal receiving and converting circuit is connected to the binding wire through the electrostatic discharge circuit; and the signal receiving and converting circuit is configured to receive a second voltage signal through the binding wire and convert the second voltage signal into a third voltage signal.

In some possible implementations, the signal receiving and converting circuit includes:

a bias circuit and at least one voltage comparison circuit;

where the bias circuit is configured to provide a bias current and a bias voltage signal for the at least one voltage comparison circuit; and the voltage comparison circuit is configured to receive the second voltage signal and the bias voltage signal, and generate the third voltage signal according to a comparison result of the second voltage signal and the bias voltage signal.

In some possible implementations, the voltage comparison circuit includes:

a fourth MOS transistor;

where a drain of the fourth MOS transistor is configured to receive the bias current output by the bias circuit, a gate of the fourth MOS transistor is configured to receive the bias voltage signal, and a source of the fourth MOS transistor is configured to receive the second voltage signal.

In some possible implementations, the voltage comparison circuit further includes:

a first inverter and a second inverter;

where the drain of the fourth MOS transistor is connected to the second inverter through the first inverter; and an output signal of the second inverter is the third voltage signal.

In some possible implementations, the voltage comparison circuit further includes:

a voltage dividing circuit and a signal generating circuit;

where the drain of the fourth MOS transistor is connected to one end of the voltage dividing circuit, and the other end of the voltage dividing circuit is configured to receive the bias current;

the two ends of the voltage dividing circuit are respectively connected to a first input end and a second input end of the signal generating circuit; and the signal generating circuit is configured to receive voltage signals at the two ends of the voltage dividing circuit and generate a fourth voltage signal according to the voltage signals at the two ends of the voltage dividing circuit.

In some possible implementations, the voltage comparison circuit further includes:

a third inverter;

where an output end of the signal generating circuit is connected to an input end of the third inverter, and a signal output by an output end of the third inverter is the third voltage signal.

In some possible implementations, the signal generating circuit includes:

a fifth MOS transistor and a sixth MOS transistor;

where the two ends of the voltage dividing circuit are respectively connected to a gate of the fifth MOS transistor and a gate of the sixth MOS transistor, the fifth MOS transistor is connected to the ground through the sixth MOS transistor, and a drain of the sixth MOS transistor is configured to output the fourth voltage signal.

In some possible implementations, the voltage dividing circuit includes:

a seventh MOS transistor and a first current source;

where a source of the seventh MOS transistor is connected to the gate of the fifth MOS transistor, a gate of the seventh MOS transistor is connected to the gate of the sixth MOS transistor, the gate of the seventh MOS transistor is connected to a drain of the seventh MOS transistor, and the drain of the seventh MOS transistor is connected to the ground through the first current source.

In some possible implementations, the bias circuit includes:

an eighth MOS transistor, a ninth MOS transistor, a tenth MOS transistor, an eleventh MOS transistor, a first resistor, and a second current source;

where the eighth MOS transistor is connected to the ground through the second current source;

the ninth MOS transistor is connected to one end of the first resistor through the tenth MOS transistor, and the other end of the first resistor is connected to the ground;

the eleventh MOS transistor is configured to provide the bias current for the voltage comparison circuit;

the eighth MOS transistor and the ninth MOS transistor constitute a first current mirror, and a mirroring ratio of the eighth MOS transistor to the ninth MOS transistor is 1:K; and the eighth MOS transistor and the eleventh MOS transistor constitute a second current mirror, a mirroring ratio of the eighth MOS transistor to the eleventh MOS transistor is 1:K*L, and a mirroring ratio of the tenth MOS transistor to the fourth MOS transistor is 1:L, where K>1, L>1.

In some possible implementations, the bias circuit further includes:

a twelfth MOS transistor, where a gate of the twelfth MOS transistor is configured to receive a fourth control signal, a drain of the twelfth MOS transistor is connected to a gate the tenth MOS transistor, and a source of the twelfth MOS transistor is connected to the ground.

According to a second aspect, provided is a data interface, including:

a fourth MOS transistor, a voltage dividing circuit and a signal generating circuit;

where a drain of the fourth MOS transistor is connected to one end of the voltage dividing circuit, the other end of the voltage dividing circuit is configured to receive a bias current, a gate of the fourth MOS transistor is configured to receive a bias voltage, and a source of the fourth MOS transistor is configured to receive a second voltage signal transmitted by a transmitting end;

the two ends of the voltage dividing circuit are respectively connected to a first input end and a second input end of the signal generating circuit; and the signal generating circuit is configured to receive voltage signals at the two ends of the voltage dividing circuit and generate a fourth voltage signal according to the voltage signals at the two ends of the voltage dividing circuit.

In some possible implementations, the data interface further includes:

a third inverter;

where an output end of the signal generating circuit is connected to an input end of the third inverter.

In some possible implementations, the signal generating circuit includes:

a fifth MOS transistor and a sixth MOS transistor;

where the two ends of the voltage dividing circuit are respectively connected to a gate of the fifth MOS transistor and a gate of the sixth MOS transistor, the fifth MOS transistor is connected to the ground through the sixth MOS transistor, and a drain of the sixth MOS transistor is configured to output the fourth voltage signal.

In some possible implementations, the voltage dividing circuit includes:

a seventh MOS transistor and a first current source;

where a source of the seventh MOS transistor is connected to the gate of the fifth MOS transistor, a gate of the seventh MOS transistor is connected to the gate of the sixth MOS transistor, the gate of the seventh MOS transistor is connected to a drain of the seventh MOS transistor, and the drain of the seventh MOS transistor is connected to the ground through the first current source.

In some possible implementations, the data interface further includes:

a bias circuit, the bias circuit including:

an eighth MOS transistor, a ninth MOS transistor, a tenth MOS transistor, an eleventh MOS transistor, a first resistor, and a second current source;

where the eighth MOS transistor is connected to the ground through the second current source;

the ninth MOS transistor is connected to one end of the first resistor through the tenth MOS transistor, and the other end of the first resistor is connected to the ground;

the eleventh MOS transistor is configured to provide the bias current for the voltage dividing circuit;

the eighth MOS transistor and the ninth MOS transistor constitute a first current mirror, and a mirroring ratio of the eighth MOS transistor to the ninth MOS transistor is 1:K; and the eighth MOS transistor and the eleventh MOS transistor constitute a second current mirror, a mirroring ratio of the eighth MOS transistor to the eleventh MOS transistor is 1:K*L, and a mirroring ratio of the tenth MOS transistor to the fourth MOS transistor is 1:L.

In some possible implementations, the bias circuit further includes:

a twelfth MOS transistor, where a gate of the twelfth MOS transistor is configured to receive a fourth control signal, a drain of the twelfth MOS transistor is connected to a gate the tenth MOS transistor, and a source of the twelfth MOS transistor is connected to the ground.

According to a third aspect, provided is chip, including:

the data interface according to the first aspect, and/or the data interface according to the second aspect.

According to a fourth aspect, provided is a chip system, including:

a plurality of chips, where a first chip and a second chip of the plurality of chips are connected by using at least one of the following data interfaces:

the data interface according to the first aspect and the data interface according to the second aspect.

DESCRIPTION OF EMBODIMENTS

Technical solutions in embodiments of the present disclosure will be described hereinafter in conjunction with the accompanying drawings. It should be understood that a data interface, a chip and a chip system of the embodiments of the present disclosure are applicable to any occasion where data communication is required, and are particularly applicable to an occasion where high-speed low power consumption communication is interconnected. The data interface is especially applicable to data communication between chips, for example, data communication between internal chips of a chip system.

In an embodiment of the present disclosure, considering that a communication channel between multiple chips is invisible to the outside, when a carrier used for transmitting a signal is voltage or current, a parasitic capacitance in the communication channel is too large.

In order to resolve the foregoing problem, the embodiment of the present disclosure provides a new data interface, which uses charges as a carrier for transmitting a signal and transferring charges of a capacitor in a transmitting circuit to a parasitic capacitor to generate a transmitting signal, thereby reducing power consumption of the data interface.

Figure 1:
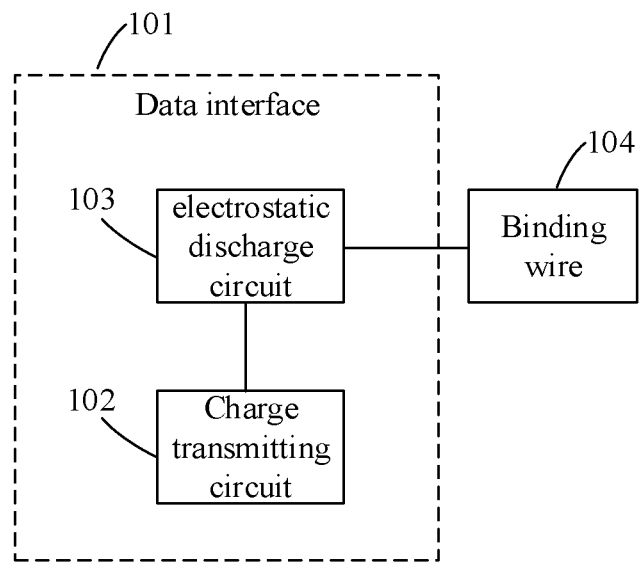
FIG. 1 is an example of a data interface of an embodiment of the present disclosure.

FIG. 1 is a schematic block diagram of a data interface (single-ended) according to an embodiment of the present disclosure.

As shown in FIG. 1, a data interface 101 may include a charge transmitting circuit 102 and an electrostatic discharge circuit 103; the charge transmitting circuit 102 is connected to a binding wire 104 through the electrostatic discharge circuit 103, and the charge transmitting circuit 102 is configured to transfer charges of a first capacitor in the charge transmitting circuit 102 to a parasitic capacitor of the electrostatic discharge circuit 103 and a parasitic capacitor of the binding wire 104 to generate a first voltage signal and output the first voltage signal through the binding wire 104.

Optionally, in an embodiment of the present disclosure, the electrostatic discharge circuit 103 is intended to prevent damage to a device caused by static electricity, especially in a chip system including a plurality of chips, since the communication channel is not exposed outside the entire chip system, the electrostatic discharge (ESD) circuit only needs to ensure that requirements of a charged device model (CDM) can be met, and its purpose is to reduce a parasitic capacitance. In addition, the bonding wire is a necessary connection wire for interconnecting chips.

According to the data interface of the embodiment of the present disclosure, charges in a charging capacitor and a parasitic capacitor are redistributed, which could not only reduce a power consumption loss caused by a parasitic capacitor in a communication channel but also effectively reduce time delay. In addition, the use of dual-wire communication is avoided by using single-wire communication, and the manufacturing costs are reduced relative to LVDS.

It should be understood that FIG. 1 is an example in which the data interface 101 only includes a transmitting circuit. In other alternative embodiments, the data interface may also include a receiving circuit. For example, the data interface may also include a signal receiving and converting circuit configured to receive a second voltage signal transmitted by a peer data interface and perform conversion processing on the second voltage signal.

Figure 2:
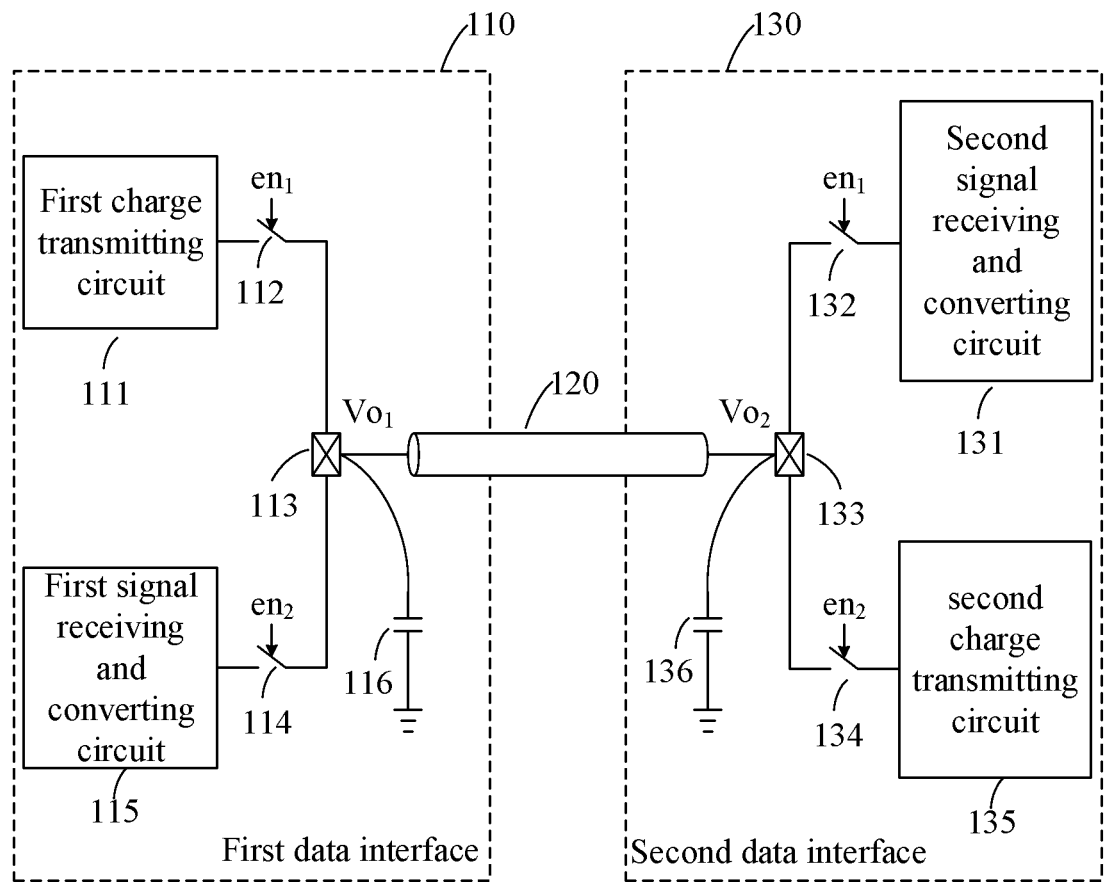
FIG. 2 is a schematic block diagram of an interface connection relationship when a data interface is applied to a transmitting end (a first data interface) and a receiving end (a second data interface) according to an embodiment of the present disclosure.

FIG. 2 is a schematic block diagram of a connection relationship between a first data interface and a second data interface according to an embodiment of the present disclosure. The first data interface and the second data interface may be regarded as a local interface and a peer interface respectively, or as a transmitting end interface and a receiving end interface respectively.

As shown in FIG. 2, a first data interface 110 may include a first charge transmitting circuit 111 and a first signal receiving and converting circuit 115; the first charge transmitting circuit 111 is connected to one end of a first electrostatic discharge circuit 113 through a first switch 112, the other end of the first electrostatic discharge circuit 113 is connected to a second data interface 130 through a binding wire 120, and the first signal receiving and converting circuit 115 is connected to the first electrostatic discharge circuit 113 through a second switch 114. Accordingly, the second data interface 130 may include a second charge transmitting circuit 135 and a second signal receiving and converting circuit 131; the second charge transmitting circuit 135 is connected to one end of a second electrostatic discharge circuit 133 through a third switch 134, the other end of the second electrostatic discharge circuit 133 is connected to the first data interface 110 through the binding wire 120, and the second signal receiving and converting circuit 131 is connected to the second electrostatic discharge circuit 133 through a fourth switch 132. It can be seen that both the first data interface 110 and the second data interface 130 shown in FIG. 2 may include a set of receiving circuit (that is, a signal receiving and converting circuit) and transmitting circuit (that is, a charge transmitting circuit) with the same function.

In actual operation, the first data interface 110 and the second data interface 130 may implement switching between the charge transmitting circuit and the signal receiving and converting circuit through the first switch 112, the second switch 114, the fourth switch 132, and the third switch 134. As an alternative implementation, as shown in FIG. 2, the first switch 112 and the fourth switch 132 may be controlled by a control signal en1, and the second switch 114 and the third switch 134 may be controlled by a control signal en2. In a specific switching process, when en1=0 and en2=1, the first data interface 110 may be used as the transmitting end and the second data interface 130 may be used as the receiving end; and when en1=1 and en2=0, the first data interface 110 may be used as the receiving end and the second data interface 130 may be used as the transmitting end, thereby implementing a half-duplex communication function.

Specifically, as shown in FIG. 2, when the first data interface 110 is used as the transmitting end and the second data interface 130 is used as the receiving end, the first data interface 110 generates a voltage signal Vo1 and transmits the voltage signal Vo1 to the second data interface 130 through the binding wire 120. When the first data interface 110 is used as the receiving end and the second data interface 130 is used as the transmitting end, the second data interface 130 generates a voltage signal Vo2 and transmits the voltage signal Vo2 to the first data interface 110 through the binding wire 120.

It should be noted here that the connection relationship of the data interfaces shown in FIG. 2 is only an example, and in other alternative embodiments, the foregoing four switches are optional if the data interface is only used for simplex communication. It should be understood that the four switches shown in FIG. 2 are not necessarily real physical switches, for example, switching between the charge transmitting circuit and the signal receiving and converting circuit may be implemented by multiplexing signals in the charge transmitting circuit and/or the signal receiving and converting circuit. It should also be understood that although both the first data interface 110 and the second data interface 130 shown in FIG. 2 may include a set of signal receiving and converting circuit and charge transmitting circuit with the same function, however, specific implementation circuits and/or used processes of the signal receiving and converting circuit and the charge transmitting circuit may be different.

Figure 3:
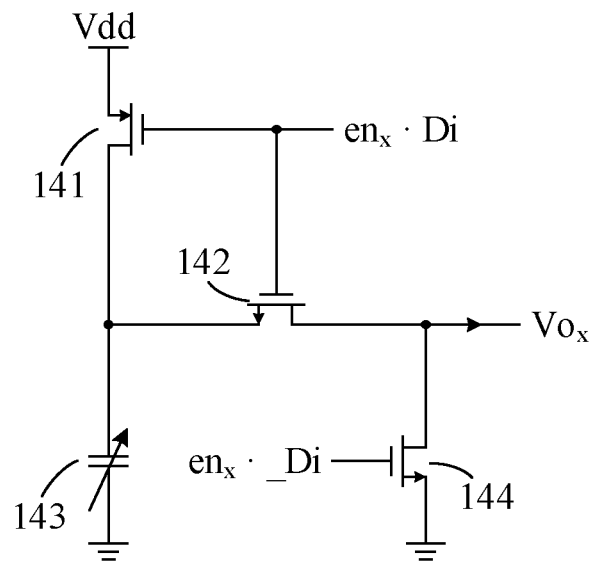
FIG. 3 is an example of a charge transmitting circuit included in a data interface according to an embodiment of the present disclosure.

FIG. 3 is an example of a charge transmitting circuit according to an embodiment of the present disclosure, and the charge transmitting circuit according to the embodiment of the present disclosure will be exemplarily described below.

As shown in FIG. 3, the charge transmitting circuit may include:

a capacitor 143, a metal-oxide-semiconductor field-effect transistor (MOSFET, MOS transistor for short) 141, a MOS transistor 142, and a MOS transistor 144; where a source of the MOS transistor 141 is configured to receive a power supply voltage, a drain of the MOS transistor 141 is connected to the ground through the capacitor 143, a gate of the MOS transistor 141 is configured to receive a first control signal, the drain of the MOS transistor 141 is connected to a source of the MOS transistor 142, a gate of the MOS transistor 142 is configured to receive the first control signal, a drain of the MOS transistor 142 is configured to output a first voltage signal $Vo_x$, the drain of the MOS transistor 142 is connected to the ground through the MOS transistor 144, a gate of the MOS transistor 144 is configured to receive a second control signal, and a source of the MOS transistor 144 is connected to the ground.

In actual operation, the first control signal and the second control signal may be control signals generated based on a third control signal.

Optionally, in some embodiments of the present application, when a voltage value of the third control signal is at a first level, the MOS transistor 142 is turned on, and the MOS transistor 141 and the MOS transistor 144 are turned off; when a voltage value of the third control signal is at a second level, the MOS transistor 142 is turned off, the MOS transistor 141 and the MOS transistor 144 are turned on, and the first level is greater than the second level.

Optionally, in some embodiments of the present application, the first control signal and the second control signal may be control signals generated based on the third control signal and at least one of the following control signals: en1 shown in FIG. 2 (for controlling the first switch 112 and the fourth switch 132) and en2 shown in FIG. 2 (for controlling the second switch 114 and the third switch 134).

In FIG. 3, the first control signal is a control signal generated by the third control signal Di and enx, and the first control signal $en_x \cdot Di$ represents a logic expression formed by performing logical "AND" on the control signal $en_x$ and the third control signal Di. The second control signal $en_x \cdot \_Di$ represents a logical expression formed by performing logical "AND" on the control signal enx and the negation of the third control signal Di.

The control signal enx may be en1 or en2, and Vox may be Vo1 or Vo2. Referring to FIG. 2, when the control signal en1 is equal to 1, the first data interface 110 may be used as a transmitting end and the second data interface 130 may be used as a receiving end, that is, the circuit shown in FIG. 3 is the first charge transmitting circuit 111 in the first data interface 110, and the first charge transmitting circuit 111 may be configured to generate a voltage signal Vo1; and when the control signal en2 is equal to 1, the first data interface 110 may be used as a receiving end and the second data interface 130 may be used as a transmitting end, that is, the circuit shown in FIG. 3 is the second charge transmitting circuit 135 in the second data interface 130, the second charge transmitting circuit 135 may be configured to generate a voltage signal Vo2.

A working principle of a circuit shown in FIG. 3 will be described below by taking the circuit shown in FIG. 3 being the first charge transmitting circuit 111 (that is, $en_x$ is en1 and $Vo_x$ is Vo1) in the first data interface 110 as an example.

In an embodiment of the present disclosure, when en1=0, the MOS transistor 141 may be enabled to be turned on, so that the capacitor 143 may be pre-charged until a voltage is equal to a power supply voltage Vdd, and the MOS transistor 142 and the MOS transistor 144 may be controlled to be turned off. At this time, Vo1 outputs high resistance, and the charge transmitting circuit is in a disabled state.

When en1=1, if Di=1, $en_x \cdot Di=1$ and $en_x \cdot \_Di=0$, at this time, the MOS transistor 141 and the MOS transistor 144 are turned off, the MOS transistor 142 is turned on, and the circuit enters an enabled state. At this time, charges on the pre-charged capacitor 143 are dumped on parasitic capacitors of the electrostatic discharge circuit and the binding wire, and different voltage values may be obtained by adjusting the capacitor 143, as shown in the following equation:

$$V_{O1,2} = \frac{C_1}{C_1 + C_{P1} + C_{P2}} * V_{dd} \quad (1)$$

If Di=0, en$_x$ Di=0 and en$_x$·_Di=0, at this time, the MOS transistor 141 and the MOS transistor 144 are turned on, the MOS transistor 142 is turned off, the capacitor 143 is pre-charged until a voltage is equal to a power supply voltage Vdd, a voltage of Vo1 is pulled to the ground, and its power consumption for full-speed inversion at an operating frequency F is:

$$I_P = (C_{P1} + C_{P2}) * V_{O1,2} * F = \frac{C_1}{C_1 + C_{P1} + C_{P2}} * (C_{P1} + C_{P2}) * V_{dd} * F \quad (2)$$

In addition, power consumption of GPIO for full-speed inversion at an operating frequency F is as follows:

$$I_{P,GPIO} = (C_{P1} + C_{P2}) * V_{dd} * F \quad (3)$$

By comparing equation (2) with equation (3), it can be seen that the power consumption of the data interface provided by the present application decreases as the capacitance 143 decreases.

The signal receiving and converting circuit in the embodiment of the present disclosure may be connected to the binding wire through the electrostatic discharge circuit; and the signal receiving and converting circuit is configured to receive a second voltage signal and convert the second voltage signal into a third voltage signal.

Optionally, the signal receiving and converting circuit may include:

a bias circuit and at least one voltage comparison circuit; where the bias circuit is configured to provide a bias current and a bias voltage signal for the at least one voltage comparison circuit, and the voltage comparison circuit is configured to receive the second voltage signal and the bias voltage signal and generate the third voltage signal according to a comparison result of the second voltage signal and the bias voltage signal, where the third voltage signal may be a signal directly used by a chip or a processor.

Figure 4:
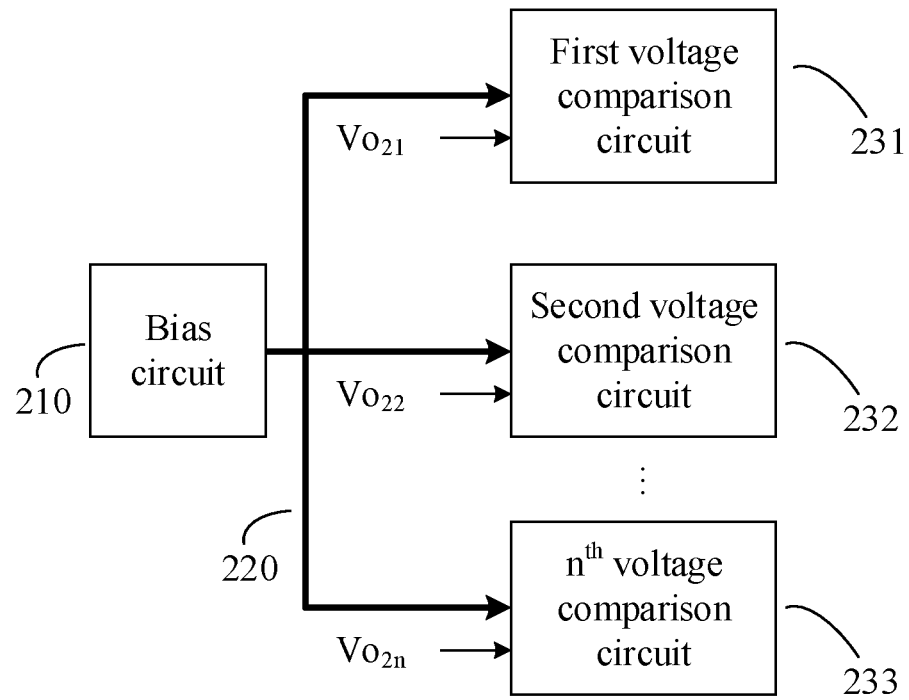
FIG. 4 is a schematic block diagram of a signal receiving and converting circuit included in a data interface according to an embodiment of the present disclosure, where the signal receiving and converting circuit includes a bias circuit and a voltage comparison circuit.

For example, as shown in FIG. 4, the signal receiving and converting circuit may include a bias circuit 210 and n voltage comparison circuits (as shown in the figure, a first voltage comparison circuit 231, a second voltage comparison circuit 232, and an n$^{th}$ voltage comparison circuit 233).

With reference to FIG. 2, when the data interface 110 in the embodiment of the present application is used as a receiving end, it may be configured to include a plurality of first signal receiving and converting circuits 115, and each of the first signal receiving and converting circuits 115 may include one bias circuit 210 and n voltage comparison circuits (as shown in the figure, the first voltage comparison circuit 231, the second voltage comparison circuit 232, and the n$^{th}$ voltage comparison circuit 233). Each of the n voltage comparison circuits is respectively configured to receive one second voltage signal. In other words, the n voltage comparison circuits may be configured to receive n second voltage signals, and the n second voltage signals may include Vo$_{21}$, Vo$_{22}$, ..., to Vo$_{2n}$ as shown in FIG. 4.

For example, taking the first voltage comparison circuit shown in FIG. 4 as an example, when the second voltage signal received by the data interface 110 is Vo$_{21}$, the first voltage comparison circuit 231 shown in FIG. 4 is configured to receive the second voltage signal Vo$_{21}$ and the bias voltage signal, and generate a third voltage signal according to a comparison result of the second voltage signal Vo$_{21}$ and the bias voltage signal and output the third voltage signal, that is, the third voltage signal is a signal that may be directly used by a chip or a processor.

In an embodiment of the present disclosure, a plurality of voltage comparison circuits may be configured with one bias circuit, or each of voltage comparison circuits may be configured with one bias circuit, and in a parallel transmission scenario, power consumption could be effectively reduced by using a configuration manner of configuring one bias circuit for a plurality of voltage comparison circuits. It should be noted that with regard to the configuration manner of configuring one bias circuit for the plurality of voltage comparison circuits, circuit structures and/or used processes of the plurality of voltage comparison circuits may be different.

Figure 5:
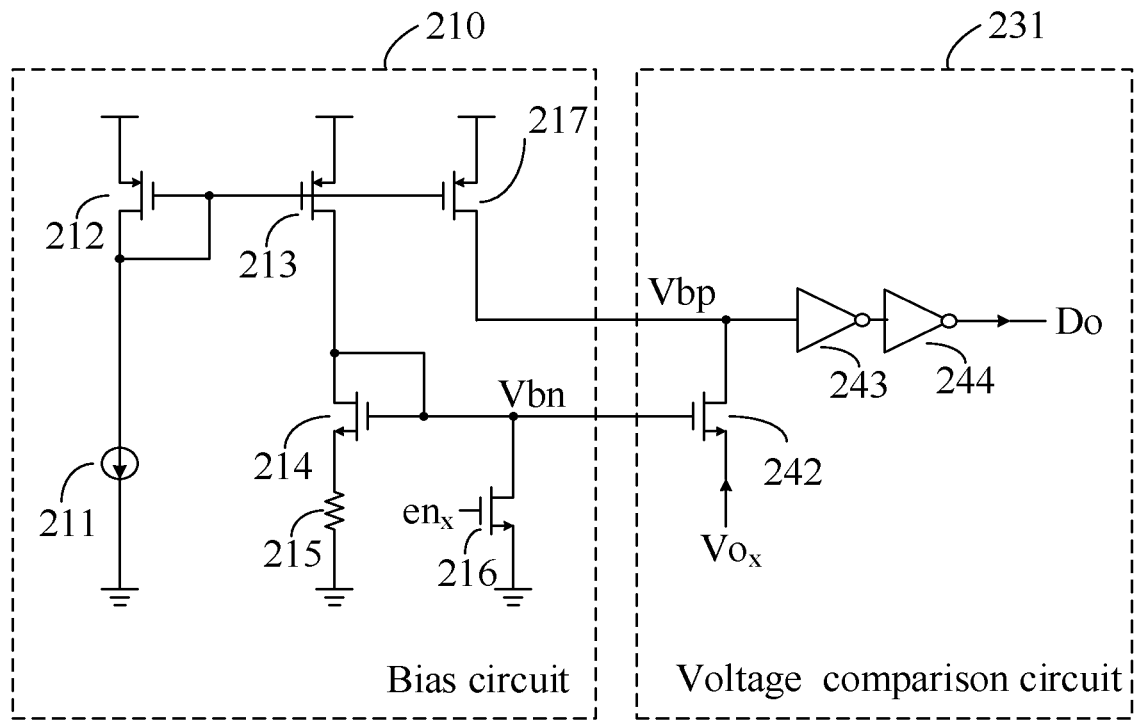
FIG. 5 is an exemplary diagram of a signal receiving and converting circuit included in a data interface according to an embodiment of the present disclosure.
Figure 6:
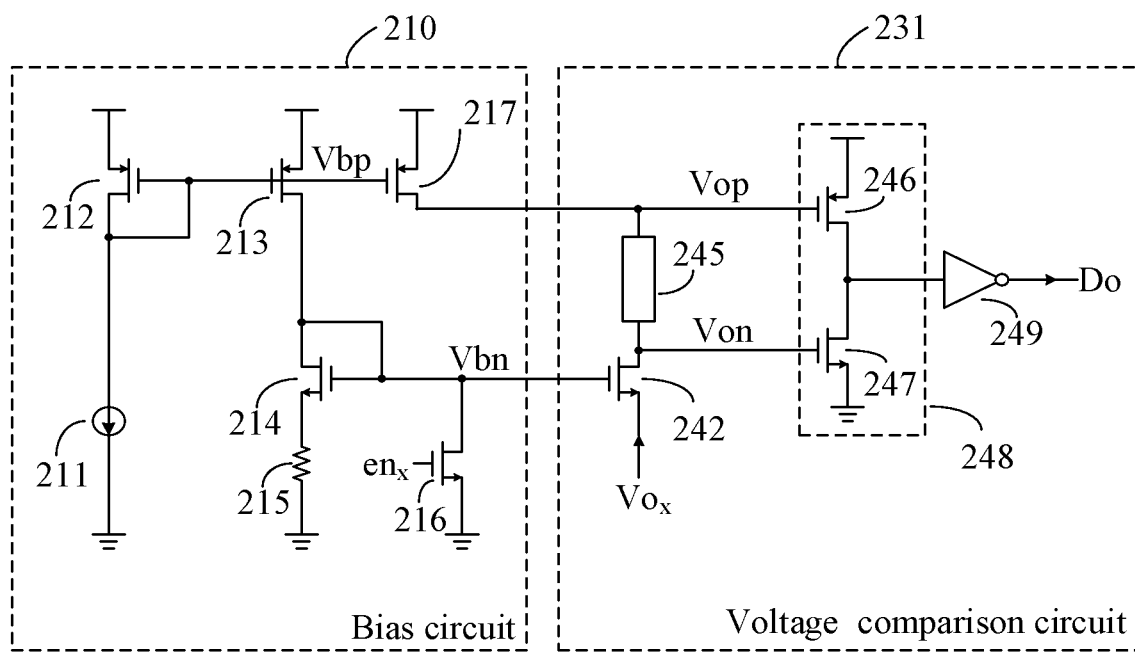
FIG. 6 is another exemplary diagram of a signal receiving and converting circuit included in a data interface according to an embodiment of the present disclosure.

FIGS. 5 and 6 are examples of a signal receiving and converting circuit according to an embodiment of the present disclosure. An embodiment in which a single bias circuit corresponds to a single voltage comparison circuit (the voltage comparison circuit 231 as shown in FIG. 4) is given below. Since some components in FIGS. 5 and 6 are similar, for convenience of explanation, the same reference numerals are used to denote the same components.

As shown in FIG. 5 or FIG. 6, the signal receiving and converting circuit may include a bias circuit 210 and a voltage comparison circuit 231.

It should be understood that the bias circuit in an embodiment of the present disclosure is intended to provide a bias current and a bias voltage signal for the voltage comparison circuit. A specific circuit structure and used process of the bias circuit are not limited in the embodiment of the present disclosure.

As an example, as shown in FIG. 5 or FIG. 6, the bias circuit 210 may include:

a MOS transistor 212, a MOS transistor 213, a MOS transistor 214, a MOS transistor 217, a resistor 215, and a current source 211; where the MOS transistor 212 is connected to the ground through the current source 211; the MOS transistor 213 is connected to one end of the resistor 215 through the MOS transistor 214, and the other end of the resistor 215 is connected to the ground; the MOS transistor 217 is configured to provide a bias current for the voltage comparison circuit 231; the MOS transistor 212 and the MOS transistor 213 constitute a first current mirror, and a mirroring ratio of the MOS transistor 212 to the MOS transistor 213 is 1:K; and the MOS transistor 212 and the MOS transistor 217 constitute a second current mirror, a mirroring ratio of the MOS transistor 212 to the MOS transistor 217 is 1:K*L, and a mirroring ratio of the MOS transistor 214 to the MOS transistor 242 is 1:L, where K>1, L>1. The resistor 215 is configured to generate a bias voltage signal.

Optionally, as shown in FIG. 5 or FIG. 6, the bias circuit 210 may include:

a MOS transistor 216, where a gate of the MOS transistor 216 is configured to receive a fourth control signal, which may be en$_x$, and further, en$_x$ may be en1 shown in FIG. 2 (for controlling the first switch 112 and the fourth switch 132) and en2 shown in FIG. 2 (for controlling the second switch 114 and the third switch 134). A drain of the MOS transistor 216 is connected to a gate of the MOS 214, and a source of the MOS transistor 216 is connected to the ground.

In an embodiment of the present application, by controlling ON or OFF of the MOS transistor 216, power consumption when the data interface is in a non-operation state could be effectively saved.

In addition, as shown in FIG. 5 or FIG. 6, the voltage comparison circuit 231 may include:

a MOS transistor 242; where a drain of the MOS transistor 242 is configured to receive the bias current output by the bias circuit 210, a gate of the MOS transistor 242 is configured to receive the bias voltage signal, and a source of the MOS transistor 242 is configured to receive the second voltage signal.

Further, as shown in FIG. 5, the voltage comparison circuit 231 may further include:

an inverter 243 and an inverter 244; where the drain of the MOS transistor 242 is connected to the inverter 244 through the inverter 243; at this time, an output signal of the inverter 244 is the third voltage signal.

In actual operation, the current source 211 provides a definite reference current for the entire signal receiving and converting circuit. The MOS transistor 212 and the MOS transistor 213 constitute a first current mirror, a current of the current source 211 is mirrored to a branch where the MOS transistor 213, the MOS transistor 214 and the resistor 215 are located; and assuming that a mirroring ratio of the MOS transistor 212 to the MOS transistor 213 is 1:K, a voltage drop across the resistor 215 may be calculated according to the equation (4):

$$V_r = K*I_b*R \quad (4)$$

In the bias circuit 210, the MOS transistor 212 and the MOS transistor 217 constitute a current mirror similarly. Assuming that the MOS transistor 212 and the MOS transistor 217 constitute a second current mirror and a mirroring ratio of the MOS transistor 212 to the MOS transistor 217 is 1:K*L, a current flowing through the MOS transistor 217 in a saturated state is $K*L*I_b$. In addition, the MOS transistor 242 is an amplifying transistor in the voltage comparison circuit 231, if a mirroring ratio of the MOS transistor 214 to the MOS transistor 242 is designed to be 1:L, when a voltage of the second voltage signal (Vox) is equal to a voltage of the bias voltage signal (Vr), a current of the MOS transistor 217 is exactly the same as a current of the MOS transistor 242, that is, the point Vox=Vr is an inversion threshold point of the voltage comparison circuit 231. In other words, when Vox>Vr, the drain of the MOS transistor 242 outputs 1, and when Vox<Vr, the drain of the MOS transistor 242 outputs 0.

Referring to FIG. 5, after being amplified by the inverter 243 and the inverter 244, the signal output by the drain of the MOS transistor 242 can output a stable standard logic level (0 or 1).

However, it can be found from the analysis that, in the voltage comparison circuit 231 shown in FIG. 5, a swing amplitude of the second voltage signal (Vox) is generally only on the order of a few hundred mV, however, a power supply voltage of the voltage comparison circuit 231 is relatively much higher, generally on the order of a few V. Therefore, a node of a drain end of the MOS transistor 242 needs to swing from the ground to the power supply voltage, which depends entirely on a parasitic capacitance of a charging node of the MOS transistor 217. If a charging current is increased by increasing the width to length ratio of the MOS transistor 217, the power consumption of the voltage comparison circuit 231 increases dramatically.

In order to resolve this problem, the embodiment of the present disclosure simply modifies the voltage comparison circuit 231 shown in FIG. 5, to form a voltage comparison circuit 231 shown in FIG. 6.

As shown in FIG. 6, the voltage comparison circuit 231 may further include:

a voltage dividing circuit 245 and a signal generating circuit 248; where a drain of the MOS transistor 242 is connected to one end of the voltage dividing circuit 245, and the other end of the voltage dividing circuit 245 is connected to a MOS transistor 217; the two ends of the voltage dividing circuit 245 are also respectively connected to a first input end and a second input end of the signal generating circuit 248; and the signal generating circuit 248 is configured to receive voltage signals at the two ends of the voltage dividing circuit 245 and generate a fourth voltage signal according to the voltage signals at the two ends of the voltage dividing circuit 245.

Further, as shown in FIG. 6, the voltage comparison circuit 231 may further include:

an inverter 249; where an output end of the signal generating circuit 248 is connected to an input end of the inverter 249; at this time, a signal output by an output end of the inverter 249 is the third voltage signal.

Regarding the voltage comparison circuit 231 relative to the circuit structure shown in FIG. 5, in FIG. 6, gates of two MOS transistors in the inverter 243 are respectively used as one input end to form the signal generating circuit 248, and the voltage dividing circuit 245 is designed between the MOS transistor 217 and the MOS transistor 242.

As an example, as shown in FIG. 6, the signal generating circuit 248 may include:

a MOS transistor 246 and a MOS transistor 247; where the two ends of the voltage dividing circuit 245 are respectively connected to a gate of the MOS transistor 246 and a gate of the MOS transistor 247, the MOS transistor 246 is connected to the ground through the MOS transistor 247, and a drain of the MOS transistor 247 is configured to output the fourth voltage signal.

Figure 7:
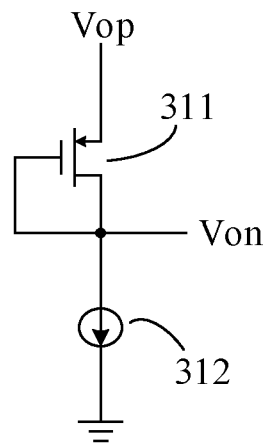
FIG. 7 is an example of a voltage dividing circuit included in a data interface according to an embodiment of the present disclosure.

As an example of a low-cost design, as shown in FIG. 7, the voltage dividing circuit 245 may include:

a MOS transistor 311 and a current source 312; where a source of the MOS transistor 311 is connected to the gate of the MOS transistor 246, a gate of the MOS transistor 311 is connected to the gate of the MOS transistor 247, the gate of the MOS transistor 311 is connected to a drain of the MOS transistor 311, and the drain of the MOS transistor 311 is connected to the ground through the current source 312.

An operating process of the voltage comparison circuit 231 will be described below with reference to FIG. 6.

In actual operation, when Vox>Vr, the MOS transistor 242 enters a cut-off region, and the MOS transistor 217 pulls up voltages of the two ends of the voltage dividing circuit 245 (Vop and Von as shown in FIG. 6) until Vop rises to the power supply voltage, allowing the MOS transistor 217 to enter a linear region. Since the current of the current source 312 shown in FIG. 7 is much smaller than the current of the current source 211 shown in FIG. 6, Vop is approximately equal to the power supply voltage, thereby ensuring that the MOS transistor 246 can be normally turned off. In addition, due to co-effect of the MOS transistor 311 and the current source 312, the voltage dividing circuit 245 has a voltage drop of Vgs, so that Von will never rise to the power supply voltage. At this time, since Von is large enough, the MOS transistor 247 can be ensured to be turned on, and further 0 is output, then 1 is output after passing through the inverter 249, that is, a Do output is 1. Correspondingly, when Vox<Vr, the operating process of the voltage comparison circuit 231 is exactly opposite to that described above, and details are not described repeatedly herein to avoid repetition.

It can be seen from the foregoing analysis that due to the addition of the voltage dividing circuit 245, a swing amplitude of Vop is Vdd~V_gs, and a swing amplitude of Von is (Vdd−V_gs)~0, thereby reducing a swing amplitude required for final stability of each node by the MOS transistor 246, decreasing charging time and transmission delay.

Furthermore, in a case where the transmission delay is ensured unchanged, a charging current of the MOS transistor 217 may also be reduced, and the power consumption of the voltage comparison circuit 231 could be effectively reduced.

In addition, since the swing amplitude of Vop is Vdd~V_gs and the swing amplitude of Von is (Vdd−V_gs) ~0, the MOS transistor 246 and the MOS transistor 247 can be avoided to be turned on simultaneously, thereby further reducing the power consumption of the voltage comparison circuit 231.

To sum up, when the data interface of the embodiment of the present disclosure is configured to transmit a signal, charges in a charging capacitor and a parasitic capacitor are redistributed, which could not only reduce a power consumption loss caused by a parasitic capacitor in a communication channel but also effectively reduce time delay. In addition, the use of dual-wire communication is avoided by using single-wire communication, and the manufacturing costs are reduced relative to LVDS. In addition, when the data interface of the embodiment of the present disclosure is configured to receive a signal, the voltage dividing circuit can not only effectively reduce a swing amplitude of a node in the voltage comparison circuit, so that the voltage comparator may operate at a higher speed under the same power consumption, but also could further reduce the power consumption.

It should be understood that the voltage dividing circuit 245 shown in FIG. 7 is only an example, and the specific structure of the circuit is not limited in the embodiment of the present disclosure. For example, in an implementable manner, the voltage dividing circuit may be a resistor or a diode.

It should also be understood that preferred embodiments of the present application have been described above in detail with reference to FIGS. 1 to 7. However, the present application is not limited to specific details of the above embodiments. Many simple modifications may be made to the technical solution of the present application within the scope of the technical concept of the present application, and these simple modifications all fall within the scope of protection of the present application.

For example, MOS transistors may be divided into an "N-type" MOS transistor (NMOSFET) and a "P-type" MOS transistor (PMOSFET) according to a polarity of a "channel" (a working carrier); and for the NMOSFET, a source and a drain thereof are connected to a N-type semiconductor, a drain end is connected to a high voltage, a source end is connected to a low voltage, and the current actually flows in the drain. For the PMOSFET, a source and a drain thereof are connected to a P-type semiconductor, a source end is connected to a high voltage, a drain end is connected to a low voltage, and the current actually flows out the drain. Taking the signal generating circuit 248 shown in FIG. 6 as an example, the signal generating circuit 248 includes a MOS transistor 246 and a MOS transistor 247, where the MOS transistor 246 is an ""N-type" MOS transistor and the MOS transistor 247 is a "P-type" MOS transistor. However, the embodiment of the present disclosure is not limited thereto. For example, in other alternative embodiments, the MOS transistor 246 may be designed as a "P-type" MOS transistor, the MOS transistor 247 may be designed as an "N-type" MOS transistor, and further two inverters may be connected at the back end of the signal generating circuit to obtain a third voltage signal in the embodiment of the present disclosure.

In addition, it should be noted that various specific technical features described in the foregoing specific embodiments may be combined in any suitable manner under the condition of no contradiction, and in order to avoid unnecessary repetition, various possible combination manners will not be separately described in the present application. In addition, any combination may be made between various embodiments of the present application without departing from the idea of the present application, it should also be regarded as the disclosure of the present application.

For example, in FIG. 5 or FIG. 6, the MOS transistor 217 may be moved from the bias circuit 210 to the voltage comparison circuit 231.

For another example, the MOS transistor 216 shown in FIG. 5 or FIG. 6 is an optional MOS transistor.

The data interface including the charge transmitting circuit according to the embodiment of the present disclosure has been described with emphasis with reference to FIGS. 1 to 7, and with reference to FIG. 8, the data interface including only a voltage dividing circuit and a signal generating circuit according to an embodiment of the present disclosure will be exemplarily described below.

Figure 8:
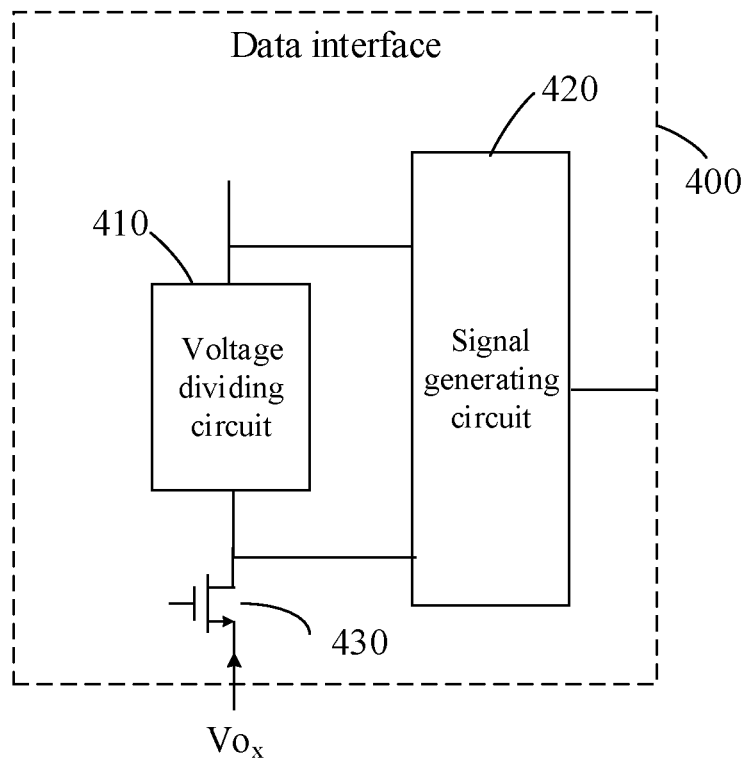
FIG. 8 is another example of a data interface according to an embodiment of the present disclosure.

FIG. 8 is another example of a data interface 400 according to an embodiment of the present disclosure.

As shown in FIG. 8, the data interface 400 may include:

a voltage dividing circuit 410 and a signal generating circuit 420;

where a drain of a fourth MOS transistor 430 is connected to one end of the voltage dividing circuit 410, the other end of the voltage dividing circuit 410 is configured to receive a bias current, a gate of the fourth MOS transistor 430 is configured to receive a bias voltage, and a source of the fourth MOS transistor 430 is configured to receive a second voltage signal transmitted by a transmitting end; and the two ends of the voltage dividing circuit 410 are also respectively connected to a first input end and a second input end of the signal generating circuit 420; the signal generating circuit 420 is configured to receive voltage signals at the two ends of the voltage dividing circuit 410 and generate a fourth voltage signal according to the voltage signals at the two ends of the voltage dividing circuit 410.

Optionally, the data interface 400 further includes:

a third inverter; an output end of the signal generating circuit 420 is connected to an input end of the third inverter.

Optionally, the signal generating circuit 420 includes:

a fifth MOS transistor and a sixth MOS transistor; where the two ends of the voltage dividing circuit 410 are respectively connected to a gate of the fifth MOS transistor and a gate of the sixth MOS transistor, the fifth MOS transistor is connected to the ground through the sixth MOS transistor, and a drain of the sixth MOS transistor is configured to output the fourth voltage signal.

Optionally, the voltage dividing circuit 410 includes:

a seventh MOS transistor and a first current source; where a source of the seventh MOS transistor is connected to the gate of the fifth MOS transistor, a gate of the seventh MOS transistor is connected to the gate of the sixth MOS transistor, the gate of the seventh MOS transistor is connected to a drain of the seventh MOS transistor, and the drain of the seventh MOS transistor is connected to the ground through the first current source.

Optionally, the data interface 400 further includes:

a bias circuit, the bias circuit includes an eighth MOS transistor, a ninth MOS transistor, a tenth MOS transistor, an eleventh MOS transistor, a first resistor and a second current source; where the eighth MOS transistor is connected to the ground through the second current source; the ninth MOS transistor is connected to one end of the first resistor through the tenth MOS transistor, and the other end of the first resistor is connected to the ground; the eleventh MOS transistor is configured to provide the bias current for the voltage dividing circuit 410; the eighth MOS transistor and the ninth MOS transistor constitute a first current mirror, and a mirroring ratio of the eighth MOS transistor to the ninth MOS transistor is 1:K; and the eighth MOS transistor and the eleventh MOS transistor constitute a second current mirror, a mirroring ratio of the eighth MOS transistor to the eleventh MOS transistor is 1:K*L, and a mirroring ratio of the tenth MOS transistor to the fourth MOS transistor 430 is 1:L.

In some possible implementations, the bias circuit further includes:

a twelfth MOS transistor, where a gate of the twelfth MOS transistor is configured to receive a fourth control signal, a drain of the twelfth MOS transistor is connected to a gate of the tenth MOS transistor, and a source of the twelfth MOS transistor is connected to the ground.

It should be understood that the voltage dividing circuit 410 in the embodiment of the present disclosure may be the voltage dividing circuit 245 shown in FIG. 6 or FIG. 7, the signal generating circuit 420 may be the signal generating circuit 248 shown in FIG. 6; a circuit structure of the voltage dividing circuit 410 and a circuit structure of the signal generating circuit 420 may refer to circuit structures shown in FIGS. 6 and 7, and the fourth MOS transistor 430 may refer to the MOS transistor 242 shown in FIG. 5 or FIG. 6. For brevity, details are not described herein.

In addition, an embodiment of the present disclosure also provides a chip or a chip system, where the chip may be configured with at least one data interface related to the above, or at least one data interface connection related to the above is adopted between the first chip and the second chip in the chip system.

Finally, it should be noted that terms used in embodiments of the present disclosure and the claims appended hereto are merely for the purpose of describing particular embodiments, and are not intended to limit the embodiments of the present disclosure. For example, the use of a singular form of "foregoing", "said" and "the" in the embodiment of the present disclosure and the claims appended hereto are also intended to include a plural form, unless otherwise clearly indicated herein by context.

A person of ordinary skill in the art may be aware that, various exemplary units described in conjunction with the embodiments disclosed herein may be implemented by electronic hardware or a combination of computer software and electronic hardware. Whether these functions are executed in hardware or software mode depends on the specific applications and design constraint conditions of the technical solution. A person skilled in the art may use different methods to implement the described functions for every particular application, but it should not be considered that such implementation goes beyond the scope of the present disclosure.

A person skilled in the art may clearly understand that the forgoing apparatus and element may or may not be physically separated for clarity and brevity. A part of or all of the elements may be selected to achieve the purposes of the embodiments of the present disclosure according to actual demands.

The forgoing contents are merely the specific implementation of the present disclosure, but the protection scope of the present disclosure is not limited thereto. Any change or substitution that is readily conceived for any one skilled in the art within the technical scope disclosed by the embodiments of the present disclosure shall fall into the protection scope of the embodiments of the present disclosure. Therefore, the protection scope of embodiments the present disclosure shall be defined by the claims.

What is claimed is:

1. A data interface comprising:
an electrostatic discharge circuit; and
a charge transmitting circuit connected to a binding wire through the electrostatic discharge circuit, wherein the charge transmitting circuit comprises a first capacitor, the charge transmitting circuit transfers charges in the first capacitor to a parasitic capacitor of the electrostatic discharge circuit and a parasitic capacitor of the binding wire, to generate a first voltage signal and output the first voltage signal through the binding wire; and
wherein the charge transmitting circuit further comprises:
a first MOS transistor, a second MOS transistor and a third MOS transistor;
wherein a source of the first MOS transistor is configured to receive a power supply voltage, a drain of the first MOS transistor is connected to the ground through the first capacitor, a gate of the first MOS transistor is configured to receive a first control signal, the drain of the first MOS transistor is connected to a source of the second MOS transistor, a drain of the second MOS transistor is configured to output the first voltage signal, a gate of the second MOS transistor is configured to receive the first control signal, and the drain of the second MOS transistor is connected to the ground through the third MOS transistor, and a gate of the third MOS transistor is configured to receive a second control signal.

2. The data interface according to claim 1, wherein the first control signal and the second control signal are both control signals generated according to a third control signal, and when a voltage value of the third control signal is at a first level, the second MOS transistor is turned on, and the first MOS transistor and the third MOS transistor are turned off; when a voltage value of the third control signal is at a second level, the second MOS transistor is turned off, the first MOS transistor and the third MOS transistor are turned on, and the first level is greater than the second level.

3. The data interface according to claim 1, wherein the data interface further comprises:
a signal receiving and converting circuit;
wherein the signal receiving and converting circuit is connected to the binding wire through the electrostatic discharge circuit; and the signal receiving and converting circuit is configured to receive a second voltage signal transmitted by a transmitting end through the binding wire and convert the second voltage signal into a third voltage signal.

4. The data interface according to claim 3, wherein the signal receiving and converting circuit comprises:
a bias circuit and at least one voltage comparison circuit;
wherein the bias circuit is configured to provide a bias current and a bias voltage signal for the at least one voltage comparison circuit; and the voltage comparison circuit is configured to receive the second voltage signal and the bias voltage signal, and generate the third voltage signal according to a comparison result of the second voltage signal and the bias voltage signal.

5. The data interface according to claim 4, wherein the voltage comparison circuit comprises:
a fourth MOS transistor;
wherein a drain of the fourth MOS transistor is configured to receive the bias current output by the bias circuit, a gate of the fourth MOS transistor is configured to receive the bias voltage signal, and a source of the fourth MOS transistor is configured to receive the second voltage signal.

6. The data interface according to claim 5, wherein the voltage comparison circuit further comprises:
   a first inverter and a second inverter;
   wherein the drain of the fourth MOS transistor is connected to the second inverter through the first inverter; and an output signal of the second inverter is the third voltage signal.

7. The data interface according to claim 5, wherein the voltage comparison circuit further comprises:
   a voltage dividing circuit and a signal generating circuit;
   wherein the drain of the fourth MOS transistor is connected to one end of the voltage dividing circuit, and the other end of the voltage dividing circuit is configured to receive the bias current; the two ends of the voltage dividing circuit are further respectively connected to a first input end and a second input end of the signal generating circuit; and the signal generating circuit is configured to receive voltage signals at the two ends of the voltage dividing circuit and generate a fourth voltage signal according to the voltage signals at the two ends of the voltage dividing circuit.

8. The data interface according to claim 7, wherein the voltage comparison circuit further comprises:
   a third inverter;
   wherein an output end of the signal generating circuit is connected to an input end of the third inverter, and a signal output by an output end of the third inverter is the third voltage signal.

9. The data interface according to claim 7, wherein the signal generating circuit comprises:
   a fifth MOS transistor and a sixth MOS transistor;
   wherein the two ends of the voltage dividing circuit are respectively connected to a gate of the fifth MOS transistor and a gate of the sixth MOS transistor, the fifth MOS transistor is connected to the ground through the sixth MOS transistor, and a drain of the sixth MOS transistor is configured to output the fourth voltage signal.

10. The data interface according to claim 9, wherein the voltage dividing circuit comprises:
    a seventh MOS transistor and a first current source;
    wherein a source of the seventh MOS transistor is connected to the gate of the fifth MOS transistor, a gate of the seventh MOS transistor is connected to the gate of the sixth MOS transistor, the gate of the seventh MOS transistor is connected to a drain of the seventh MOS transistor, and the drain of the seventh MOS transistor is connected to the ground through the first current source.

11. The data interface according to claim 4, wherein the bias circuit comprises:
    an eighth MOS transistor, a ninth MOS transistor, a tenth MOS transistor, an eleventh MOS transistor, a first resistor, and a second current source;
    wherein the eighth MOS transistor is connected to the ground through the second current source; the ninth MOS transistor is connected to one end of the first resistor through the tenth MOS transistor, and the other end of the first resistor is connected to the ground; the eleventh MOS transistor is configured to provide the bias current for the voltage comparison circuit; the eighth MOS transistor and the ninth MOS transistor constitute a first current mirror, and a mirroring ratio of the eighth MOS transistor to the ninth MOS transistor is 1:K; and the eighth MOS transistor and the eleventh MOS transistor constitute a second current mirror, a mirroring ratio of the eighth MOS transistor to the eleventh MOS transistor is 1:K*L, and a mirroring ratio of the tenth MOS transistor to the fourth MOS transistor is 1:L, wherein K>1, L>1.

12. The data interface of claim 11, wherein the bias circuit further comprises:
    a twelfth MOS transistor, wherein a gate of the twelfth MOS transistor is configured to receive a fourth control signal, a drain of the twelfth MOS transistor is connected to a gate the tenth MOS transistor, and a source of the twelfth MOS transistor is connected to the ground.

13. A data interface comprising:
    a fourth metal-oxide-semiconductor (MOS) transistor, a voltage dividing circuit and a signal generating circuit;
    wherein a drain of the fourth MOS transistor is connected to one end of the voltage dividing circuit, the other end of the voltage dividing circuit is configured to receive a bias current, a gate of the fourth MOS transistor is configured to receive a bias voltage, and a source of the fourth MOS transistor is configured to receive a second voltage signal transmitted by a transmitting end;
    the two ends of the voltage dividing circuit are respectively connected to a first input end and a second input end of the signal generating circuit; and
    the signal generating circuit is configured to receive voltage signals at the two ends of the voltage dividing circuit and generate a fourth voltage signal according to the voltage signals at the two ends of the voltage dividing circuit.

14. The data interface according to claim 13, wherein the data interface further comprises:
    a third inverter;
    wherein an output end of the signal generating circuit is connected to an input end of the third inverter.

15. The data interface according to claim 13, wherein the signal generating circuit comprises:
    a fifth MOS transistor and a sixth MOS transistor;
    wherein the two ends of the voltage dividing circuit are respectively connected to a gate of the fifth MOS transistor and a gate of the sixth MOS transistor, the fifth MOS transistor is connected to the ground through the sixth MOS transistor, and a drain of the sixth MOS transistor is configured to output the fourth voltage signal.

16. The data interface according to claim 15, wherein the voltage dividing circuit comprises:
    a seventh MOS transistor and a first current source;
    wherein a source of the seventh MOS transistor is connected to the gate of the fifth MOS transistor, a gate of the seventh MOS transistor is connected to the gate of the sixth MOS transistor, the gate of the seventh MOS transistor is connected to a drain of the seventh MOS transistor, and the drain of the seventh MOS transistor is connected to the ground through the first current source.

17. The data interface according to claim 13, wherein the data interface further comprises:
    a bias circuit, the bias circuit comprising:
    an eighth MOS transistor, a ninth MOS transistor, a tenth MOS transistor, an eleventh MOS transistor, a first resistor, and a second current source;
    wherein the eighth MOS transistor is connected to the ground through the second current source;

the ninth MOS transistor is connected to one end of the first resistor through the tenth MOS transistor, and the other end of the first resistor is connected to the ground;

the eleventh MOS transistor is configured to provide the bias current for the voltage dividing circuit;

the eighth MOS transistor and the ninth MOS transistor constitute a first current mirror, and a mirroring ratio of the eighth MOS transistor to the ninth MOS transistor is 1:K; and the eighth MOS transistor and the eleventh MOS transistor constitute a second current mirror, a mirroring ratio of the eighth MOS transistor to the eleventh MOS transistor is 1:K*L, and a mirroring ratio of the tenth MOS transistor to the fourth MOS transistor is 1:L.

18. The data interface of claim 17, wherein the bias circuit further comprises:

a twelfth MOS transistor, wherein a gate of the twelfth MOS transistor is configured to receive a fourth control signal, a drain of the twelfth MOS transistor is connected to a gate of the tenth MOS transistor, and a source of the twelfth MOS transistor is connected to the ground.

19. A chip system comprising:

a plurality of chips, wherein a first chip and a second chip of the plurality of chips are connected by using at least one data interface, wherein the data interface comprises:

an electrostatic discharge circuit; and a charge transmitting circuit connected to a binding wire through the electrostatic discharge circuit, wherein the charge transmitting circuit comprises a first capacitor, the charge transmitting circuit transfers charges in the first capacitor to a parasitic capacitor of the electrostatic discharge circuit and a parasitic capacitor of the binding wire, to generate a first voltage signal and output the first voltage signal through the binding wire; and wherein the charge transmitting circuit further comprises:

a first MOS transistor, a second MOS transistor and a third MOS transistor;

wherein a source of the first MOS transistor is configured to receive a power supply voltage, a drain of the first MOS transistor is connected to the ground through the first capacitor, a gate of the first MOS transistor is configured to receive a first control signal, the drain of the first MOS transistor is connected to a source of the second MOS transistor, a drain of the second MOS transistor is configured to output the first voltage signal, a gate of the second MOS transistor is configured to receive the first control signal, and the drain of the second MOS transistor is connected to the ground through the third MOS transistor, and a gate of the third MOS transistor is configured to receive a second control signal.

* * * * *